United States Patent
Chen et al.

[11] Patent Number: 6,162,584
[45] Date of Patent: Dec. 19, 2000

[54] METHOD OF FABRICATING POLYSILICON STRUCTURES WITH DIFFERENT RESISTANCE VALUES FOR GATE ELECTRODES, RESISTORS AND CAPACITOR PLATES IN AN INTEGRATED CIRCUIT

[75] Inventors: Sen-Fu Chen, Taipei; Chih-Heng Shen, Hsin-Chu, both of Taiwan

[73] Assignee: Taiwan Semiconductor Manufacturing Company, Hsin-Chu, Taiwan

[21] Appl. No.: 09/073,948

[22] Filed: May 7, 1998

[51] Int. Cl.⁷ .................................................. G03F 7/00
[52] U.S. Cl. ............................ 430/313; 430/314; 438/45
[58] Field of Search ................................... 430/313, 314; 438/45, 210, 238, 383, 384, 385, 532, 658, 659; 257/380

[56] References Cited

U.S. PATENT DOCUMENTS

| | | | |
|---|---|---|---|
| 4,643,777 | 2/1987 | Maeda | 148/1.5 |
| 5,141,597 | 8/1992 | Adams et al. | 156/628 |
| 5,474,948 | 12/1995 | Yamazaki | 437/60 |
| 5,514,617 | 5/1996 | Liu | 437/60 |
| 5,554,554 | 9/1996 | Bastani et al. | 437/47 |
| 5,622,884 | 4/1997 | Liu | 438/238 |
| 5,705,418 | 1/1998 | Liu | 437/46 |
| 5,739,059 | 4/1998 | Chen et al. | 438/238 |

Primary Examiner—Kathleen Duda
Attorney, Agent, or Firm—George O. Saile; Stephen B. Ackerman; Graham S. Jones, II

[57] ABSTRACT

A method is provided for forming a plurality of structures with different resistance values in a single polysilicon film as follows. Form a polysilicon layer upon a substrate. Pattern the polysilicon to expose a portion thereof which is to be reduced in thickness. Partially etch through the polysilicon to produce a reduced thickness thereof while leaving the remainder of the polysilicon with the original thickness. Dope the polysilicon layer through the polysilicon with variable doping as a function of the reduced thickness and the original thickness of the polysilicon.

6 Claims, 8 Drawing Sheets

METHOD OF FABRICATING POLYSILICON STRUCTURES WITH DIFFERENT RESISTANCE VALUES FOR GATE ELECTRODES, RESISTORS AND CAPACITOR PLATES IN AN INTEGRATED CIRCUIT

BACKGROUND OF THE INVENTION

1. Field of the Invention

This invention relates to integrated circuit devices and more particularly to the process of manufacture of polysilicon structures with varying values of resistance and the devices produced by the process.

2. Description of Related Art

In the past, to form different values of polysilicon resistance in an integrated circuit for a gate, resistor and capacitor plate, the area and length of the polysilicon need to be modified to meet the criteria, but they increase the cost of manufacturing due to the complex process and the related process issue such as lateral diffusion.

U.S. Pat. No. 5,554,554 of Bastani for "Process for Fabricating Two Loads Having Different Resistance Levels in a Common Layer of Polysilicon" provides a method of forming a first load having a first resistance level and a second load having a second resistance level in a common layer of polysilicon. A layer of polysilicon having a first resistance level is formed. A mask is then formed on the polysilicon layer to define areas of the polysilicon to be implanted with a dopant. The dopant is then implanted into the defined areas of the polysilicon to modify these areas to have a second resistance level. Selected areas of the polysilicon layer are then etched away to form first load regions having the first resistance level and second load regions having the second resistance level.

U.S. Pat. No. 5,705,418 of Liu for "Process for Fabricating Reduced-Thickness High-Resistance Load Resistors in Four-Transistor SRAM Devices" shows a method of forming polysilicon resistors where a silicon dioxide layer is used as an I/I (Ion Implantation) block. An oxidation resistant layer is formed and patterned for exposing regions of the polysilicon layer designated for the formation of the load resistors. A silicon dioxide layer is formed over the surface of the exposed portions of the polysilicon layer, so that the thickness of the designated regions of the polysilicon layer below the silicon dioxide layer is reduced. These designated regions will be formed into the load resistors. The oxidation resistant layer is then removed. Then, impurity ions are implanted into exposed regions of the polysilicon layer, not covered by the silicon dioxide layer, which are designated for forming interconnectors for the memory cell unit.

U.S. Pat. No. 5,514,617 of Liu for "Method of Making a Variable Resistance Polysilicon Conductor for SRAM Devices" shows how to produce resistors using a patterning method with an I/I process with step areas where variable doping results with higher resistance in the steeper areas than the flat areas, plus heavy doping formed in contact areas by doping through openings in a contact mask.

U.S. Pat. No. 4,643,777 of Maeda for "Method of Manufacturing a Semiconductor Device Comprising Resistors of High and Low Resistances" describes a method of forming resistors in portions of a polysilicon layer with portions covered with mask and the other portions covered with a molybdenum film. Then the molybdenum film is subjected to a silicifying step. The result is that those regions of the polysilicon film located under the molybdenum film have a low resistance, while the regions of the polysilicon film covered by the mask have a high resistance value.

See U.S. Pat. No. 5,622,884 of Liu for "Method for Manufacturing a Semiconductor Memory Cell and a Polysilicon Load Resistor of the Semiconductor Memory Cell" formed by depositing a polysilicon layer over an insulating layer. The polysilicon layer is implanted with dopant and is then masked and etched to form a high resistance load resistor.

Also see U.S. Pat. No. 5,474,948 of Yamazaki for "Method of Making a Semiconductor Device Having Polysilicon Resistance Element" which shows polysilicon load resistors.

SUMMARY OF THE INVENTION (1) Etch some polysilicon in the predetermined area of lower resistance.
(2) Control the resistance using different thickness of polysilicon.
(3) Produce different polysilicon resistance using one time doping (implantation).
(4) Lateral diffusion can be eliminated by doping posterior to patterning polysilicon and one time doping.

The invention shows a method of producing variable resistance resistors by using photo processes (mask and etch) to form different thickness of polysilicon over a silicon dioxide layer. Then ions are implanted into the polysilicon layer to dope the resistor. A important feature of this invention is the difference in polysilicon thickness.

In accordance with this invention, a method is provided for forming a plurality of structures with different resistance values in a single photoresist film comprising:

forming a polysilicon layer upon a substrate, patterning the polysilicon to expose a first portion thereof, partially etching through the first portion of the polysilicon to produce a reduced thickness portion thereof while leaving the remainder as a full thickness portion of the polysilicon with the original thickness, and doping the polysilicon layer with variable doping as a function of the reduced thickness and the original thickness of the polysilicon.

Preferably, a patterning mask is formed over the polysilicon after doping of the polysilicon layer;

a patterning mask is formed over the polysilicon before doping of the polysilicon layer; and then the polysilicon layer is patterned by the patterning mask, before doping of the polysilicon layer.

Preferably, the full thickness portion is from about 0.2 $\mu$m to about 0.4 $\mu$m thick, and the lower thickness portion is from about 0.05 $\mu$m to about 0.15 $\mu$m thick.

BRIEF DESCRIPTION OF THE DRAWINGS

The foregoing and other aspects and advantages of this invention are explained and described below with reference to the accompanying drawings, in which.

DESCRIPTION OF THE PREFERRED EMBODIMENTS

The object of the method of this invention is to produce a set of high and low resistance polysilicon structures in an integrated circuit device.

Figure 1:
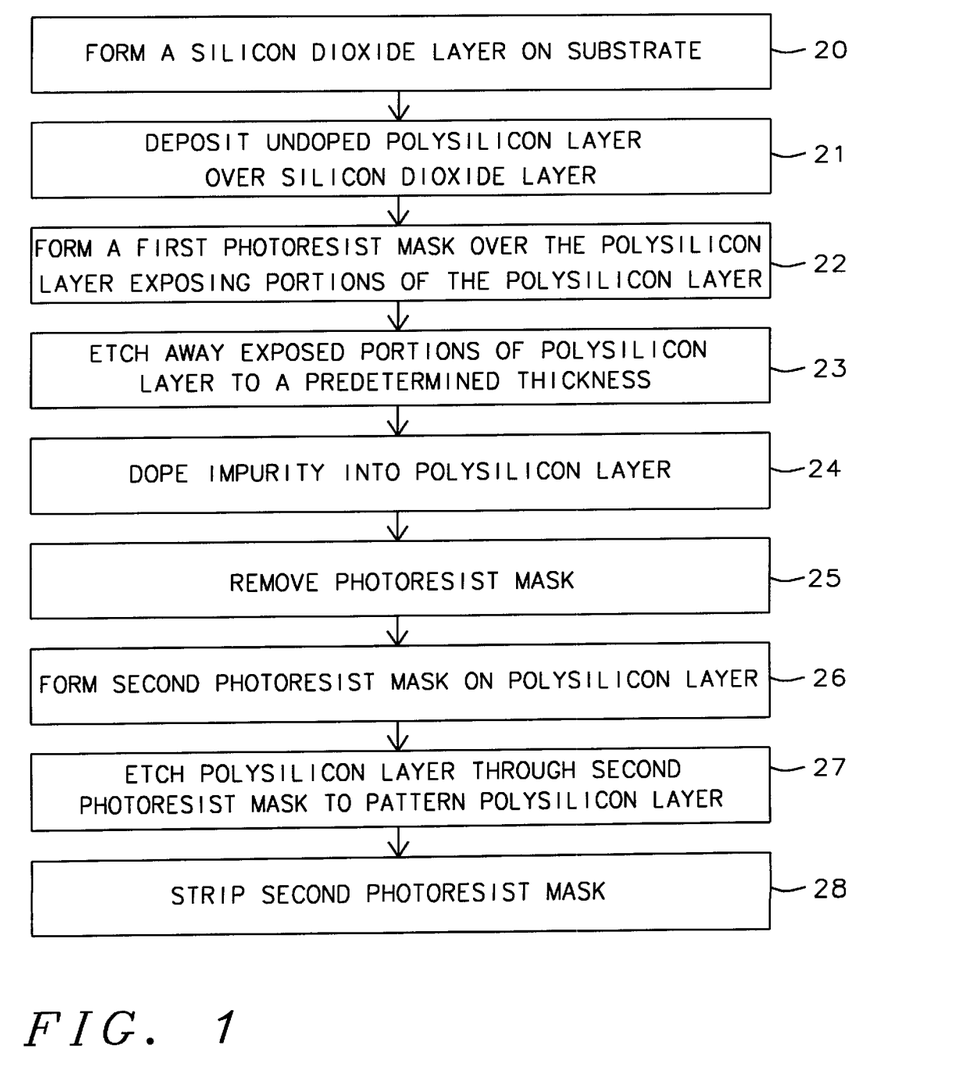
FIG. 1 shows a flow chart of processing steps in accordance with a first embodiment of this invention.

There are numerous alternative sequences of processing steps which can be performed to produce the result seen in FIG. 1G.

First Embodiment of the Invention

Figure 2A:
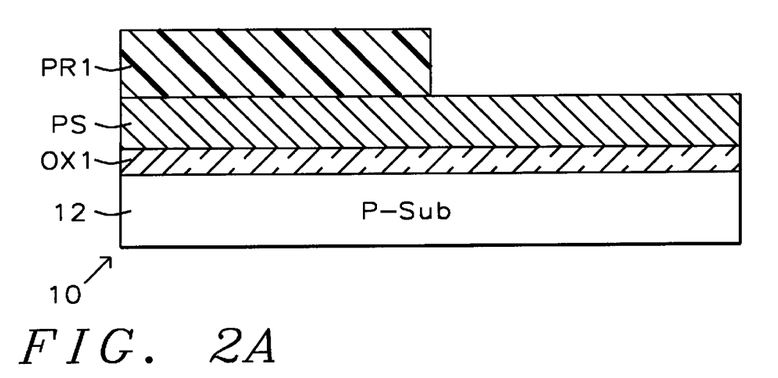
FIGS. 2A–2E illustrate a device in the process of manufacture which forms a single polysilicon layer PS into structures with different resistance values in accordance with the process of FIG. 1.

Referring to FIG. 1 and FIGS. 2A–2E, a method of forming a single polysilicon layer PS into structures with different resistance values, comprises the steps as follows:

(1) Referring to FIG. 1 in step 20, and FIG. 2A an integrated circuit device 10 is made starting with a planar substrate 12, such as a P-doped substrate. During this first step, the substrate 12 is coated with a planar silicon dioxide ($SiO_2$) layer OX1 by a CVD process or a thermal process.

This layer can be a gate oxide layer for a gate electrode or can be a field oxide layer for a resistor.

A capacitor plate can be formed over either a field oxide layer or a gate oxide layer.

(2) In step 21 deposit a polysilicon layer PS, with a thickness from about 0.2 $\mu$m to about 0.4 $\mu$m, over silicon dioxide layer OX1.

(3) Then, in step 22 define a first photoresist mask PR1 over polysilicon layer PS to produce a surface area of the exposed region of the polysilicon layer PS by leaving portions of the polysilicon layer PS exposed, i.e. without protection by first photoresist mask PR1.

Figure 2B:
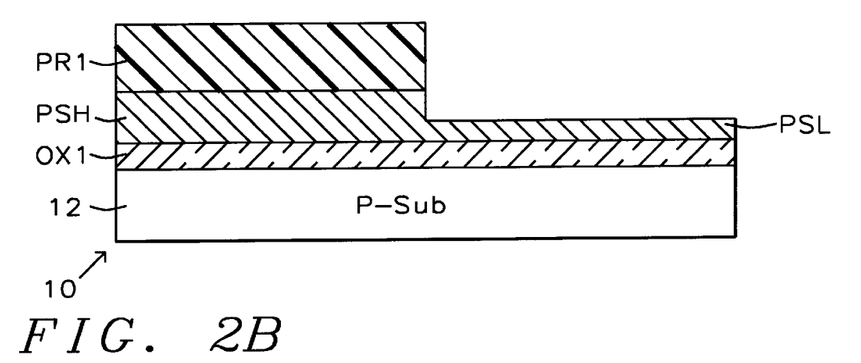

(4) Referring to FIG. 2B, in step 23 of FIG. 1, etch away a substantial thickness of the layer PS in the exposed area referred to hereinafter as the "low resistance" region PSL which has a reduced, to a predetermined thickness from about 0.05 $\mu$m to about 0.15 $\mu$m in the exposed area referred to hereinafter as region PSL.

The remainder of polysilicon layer PS comprises the thick, "high resistance" region PSH of polysilicon layer PS with its original thickness.

Figure 2C:
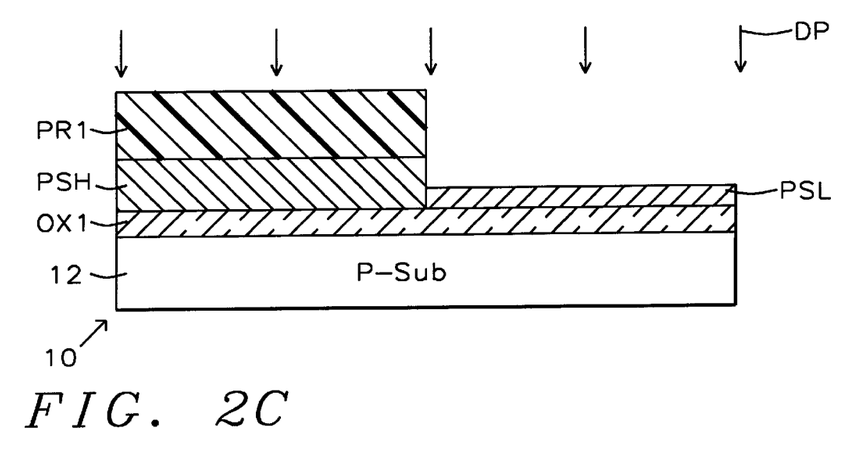

(5) Referring to FIG. 2C, in step 24 dope or ion implant an impurity DP into polysilicon layer PS to produce high resistance region PSH in the thick region and low resistance region PSL in the thin region of the polysilicon.

The doping can be provided by ion implanting with a dose of N-type or P-type dopant from about 1.0 E 12 ions/cm$^2$ to about 1.0 E 15 ions/cm$^2$ at an energy from about 30 keV to about 120 keV.

After annealing, the concentration of N-type or P-type dopant in the high resistance region PSH was from about 1.0 E 12 atoms/cm$^3$ to about 1.0 E 15 atoms/cm$^3$. The concentration of N-type or P-type dopant in the low resistance region PSL was from about 1.0 E 12 atoms/cm$^3$ to about 1.0 E 15 atoms/cm$^3$.

Figure 2D:
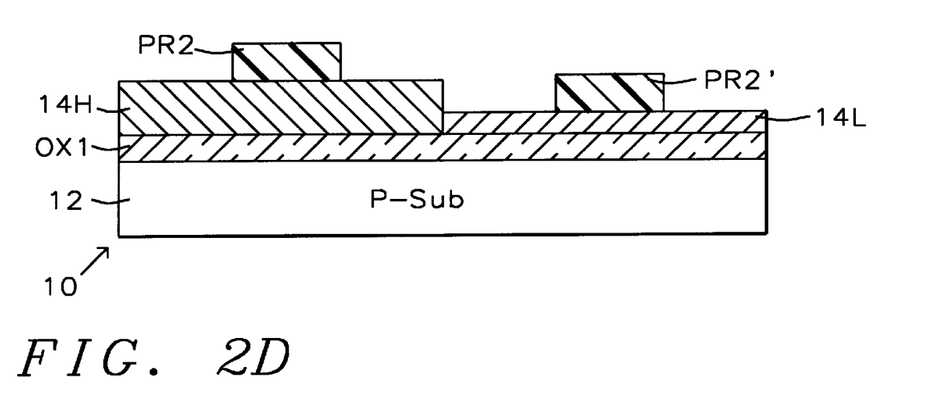

(6) Referring to FIG. 2D, in step 25, the photoresist mask PR1 has been removed leaving the thick polysilicon region 14H, as well as thin polysilicon region 14L exposed Region 14H was high resistance region PSH in FIG. 2C, and region 14L was low resistance region PSL in FIG. 2C.

(7) Referring again to FIG. 2D, in step 26 form a second mask PR2/PR2' (formed of photoresist) for patterning the thick polysilicon region 14H and the thin polysilicon region 14L using photolithography and etching down to silicon dioxide layer OX1, only.

Figure 2E:
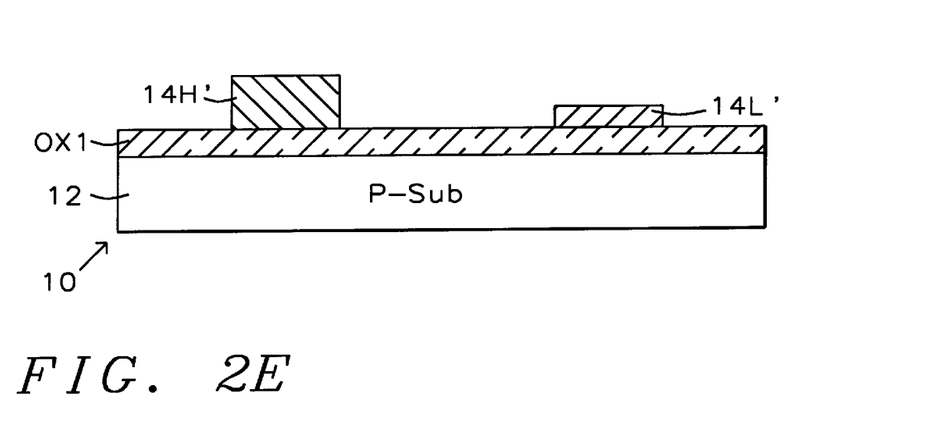

(9) Referring as shown in FIG. 2E, in step 27 polysilicon 14H and 14L were patterned by etching down to silicon dioxide layer OX1 into separate thick high resistance element 14H' under photoresist mask PR2 and thin thin, low resistance, polysilicon element 14L' under photoresist mask PR2'.

(10) Then, in step 28 the photoresist masks PR2/PR2' were stripped from the thick, high resistance, polysilicon element 14H' and thin, low resistance poly silicon element 14L' 14L'.

Second Embodiment of the Invention

Figure 3:
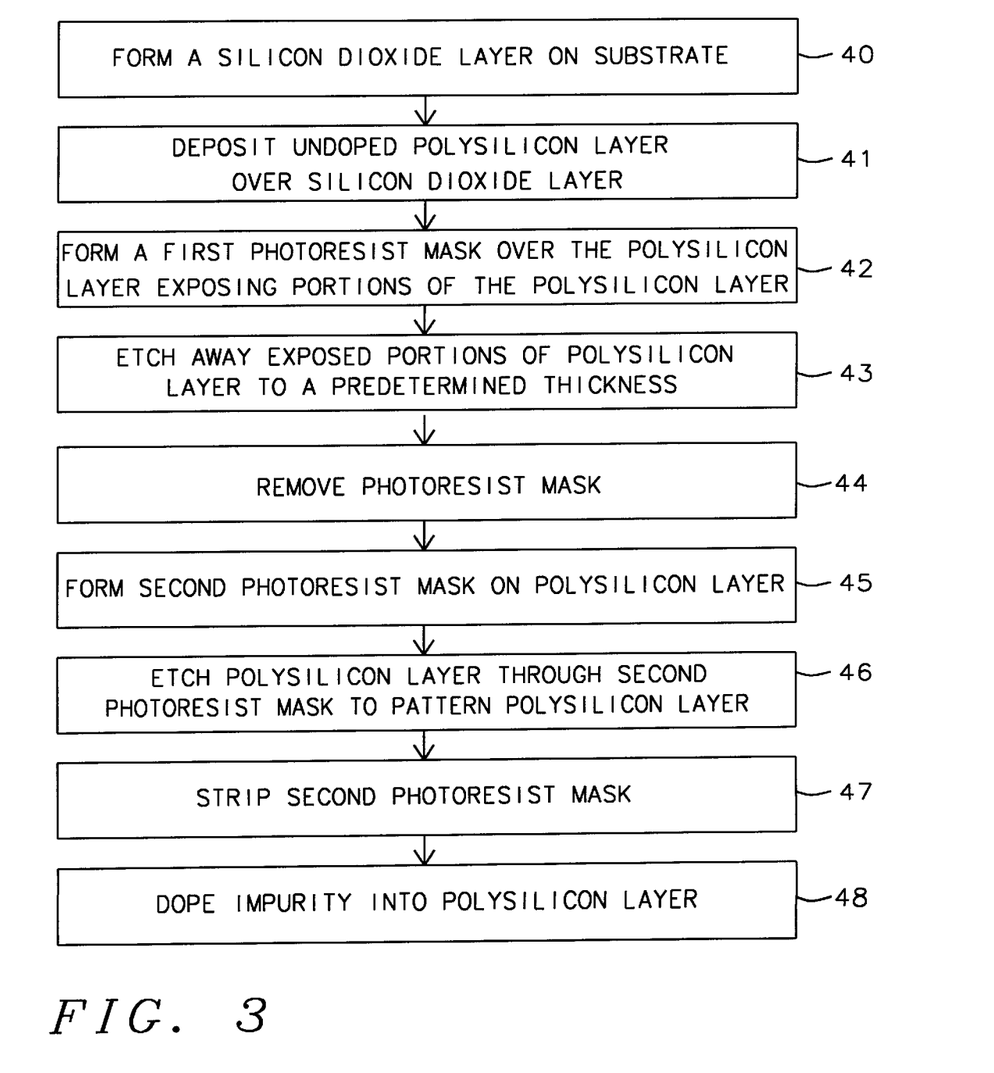
FIG. 3 shows a flow chart of processing steps in accordance with a second embodiment of this invention.
Figure 4A:
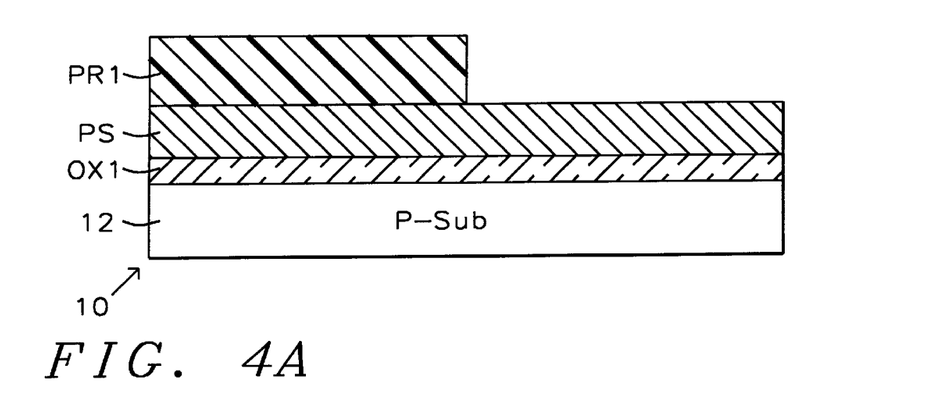
FIGS. 4A–4F illustrate a device in the process of manufacture which forms a single polysilicon layer PS into structures with different resistance values in accordance with the process of FIG. 3.

The method of the second embodiment of the invention is similar to the method of the first embodiment except that the steps are as shown in FIGS. 2A–2E with the doping step moved from FIG. 2C to FIG. 4D representing a switch in the sequence of processing of the doping step to nearer the end of the process. The method of the second embodiment is as follows:

(1) Referring to FIGS. 3 and 4A the device 10 described above is made by a different sequence of the above steps, starting with step 40 in FIG. 3 with reference to FIG. 4A. The integrated circuit device 10 is made starting with a planar substrate 12, such as a P-doped substrate. During this first step 40, the substrate 12 is coated with a planar silicon dioxide ($SiO_2$) layer OX1 by a CVD process or a thermal process.

This layer can be a gate oxide layer for a gate electrode or can be a field oxide layer for a resistor. A capacitor plate can be formed over either a field oxide layer or a gate oxide layer.

(2) In step 41 deposit a polysilicon layer PS, with a thickness from about 0.2 $\mu$m to about 0.4 $\mu$m, over silicon dioxide layer OX1.

(3) In step 42, form a first photoresist mask PR1 over layer PS to produce a surface area of the exposed region of the polysilicon layer PS by leaving a portions of the polysilicon layer PS exposed, i.e. without protection by first photoresist mask PR1.

(4) Referring to FIG. 4B, in step 43 of FIG. 3, etch away a substantial thickness of the polysilicon layer PS in the exposed area referred to hereinafter as the "low resistance" region PSL which has a reduced, predetermined thickness from about 0.05 $\mu$m to about 0.15 $\mu$m.

The thick polysilicon layer PSH comprises the thick, "high resistance" region PSH of polysilicon layer PS with its original thickness.

Figure 4B:
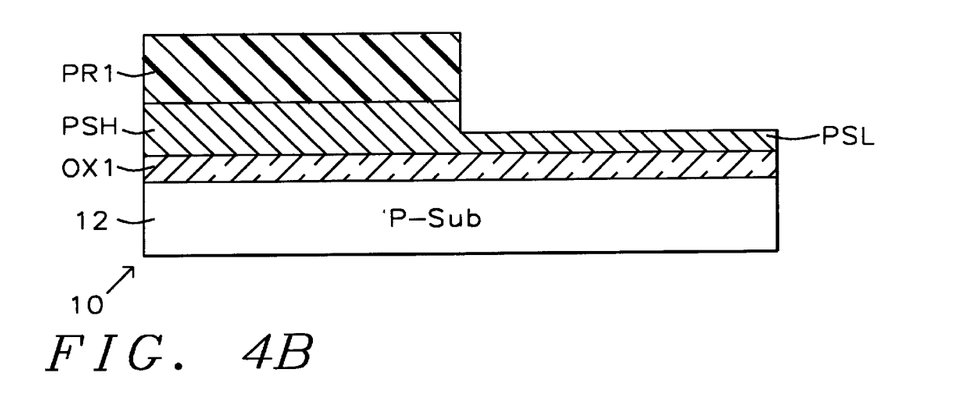
Figure 4C:
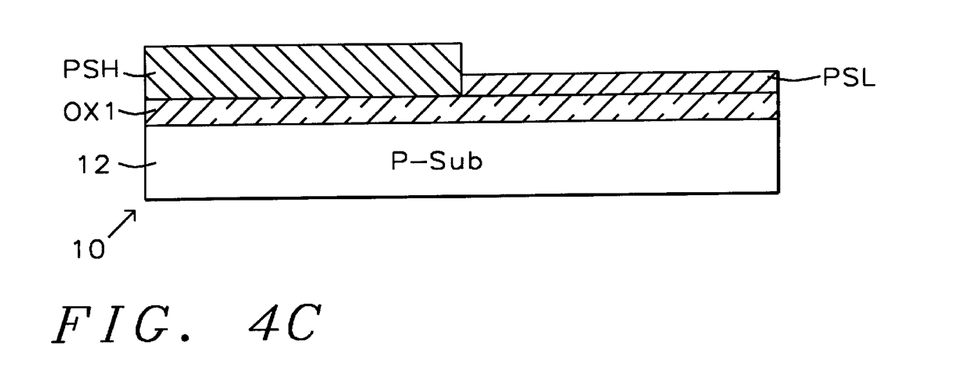

(5) Referring to FIG. 4C, in step 44, remove the photoresist mask PR1 leaving the thick region PSH, as well as thin region PSL, exposed.

Figure 4D:
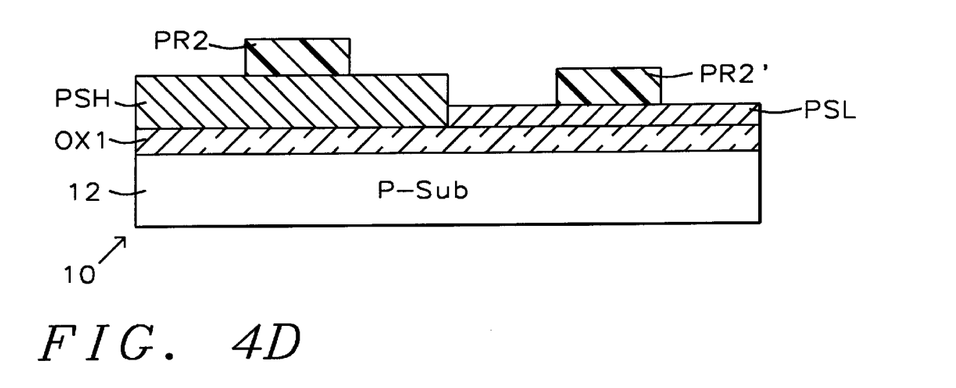

(6) Referring to FIG. 4D, in step 45, form a second mask PR2/PR2' (formed of photoresist) for patterning the thick region PSH and the thin region PSL using photolithography and etching down to the silicon dioxide layer OX1.

Figure 4E:
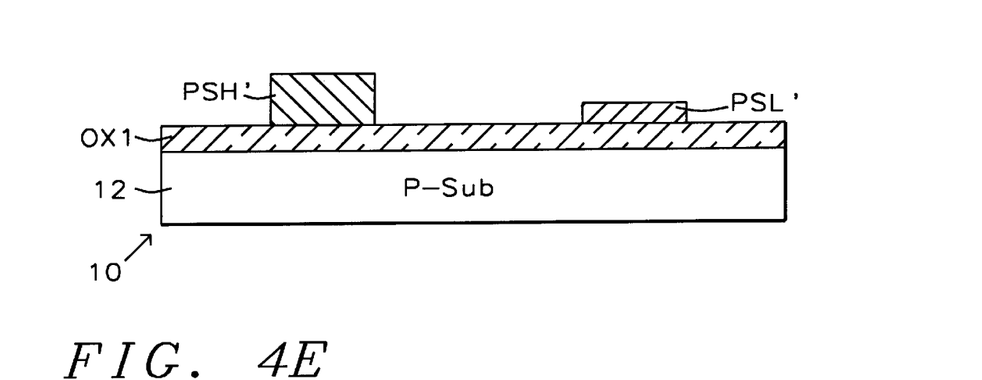

(7) Referring to FIG. 4E, as a result of step 46, layer PSH has been patterned by etching down to silicon dioxide layer OX1 using masks PR2/PR2' into separate thick high resistance resistor PSH' under photoresist mask PR2 and thin low resistance resistor PSL' under photoresist mask PR2'.

(8) Then, in step 47 the photoresist masks PR2/PR2' were stripped from the thick high resistance resistor PSH' and thin low resistance resistor PSL'.

Figure 4F:
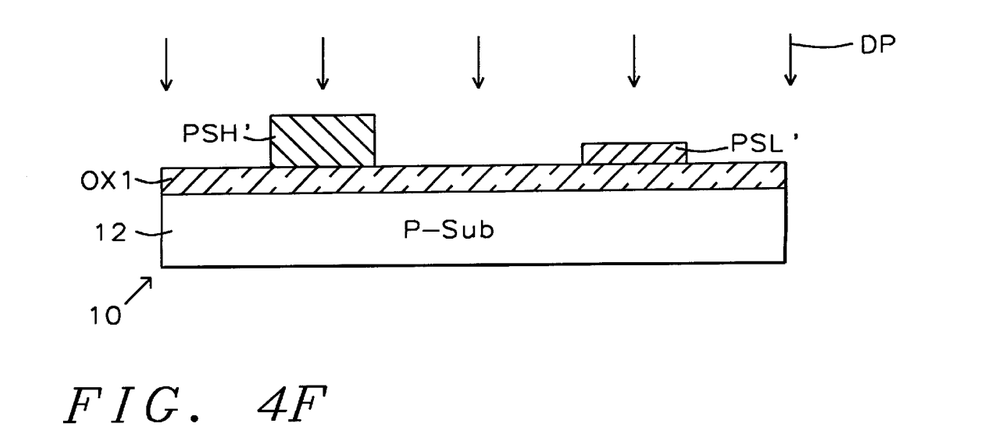

(9) Referring to FIG. 4F, in step 48 dope or ion implant an impurity DP into polysilicon layer PSH' and PSL'

The doping can be provided by ion implanting with a dose of N-type or P-type dopant from about $1.0 \text{ E } 12$ ions/cm$^2$ to about $1.0 \text{ E } 15$ ions/cm$^2$ at an energy from about 30 keV to about 120 keV.

After annealing the concentration of N-type or P-type dopant in the high resistance region PSH' was from about $1.0 \text{ E } 12$ atoms/cm$^3$ to about $1.0 \text{ E } 15$ atoms/cm$^3$. The concentration of N-type or P-type dopant in the low resistance region PSL' was from about $1.0 \text{ E } 12$ atoms/cm$^3$ to about $1.0 \text{ E } 15$ atoms/cm$^3$.

Third Embodiment of the Invention

Figure 5:
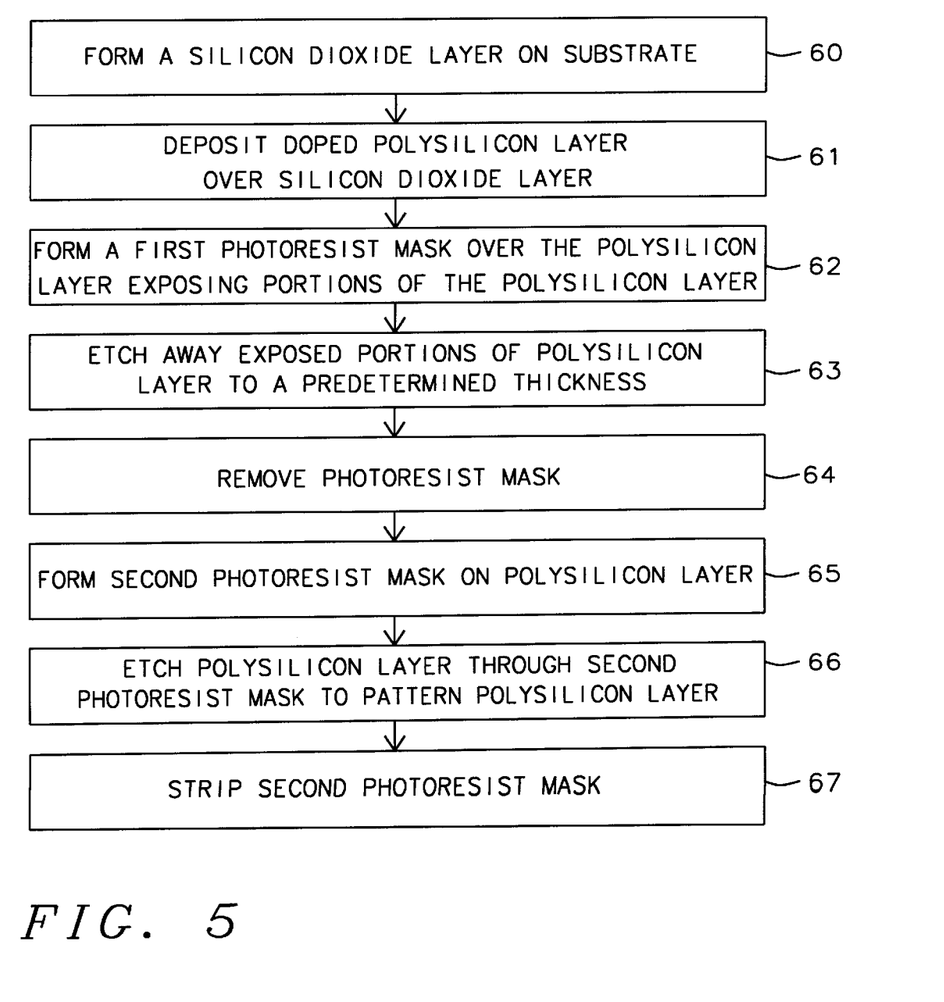
FIG. 5 shows a flow chart of processing steps in accordance with a third embodiment of this invention.
Figure 6A:
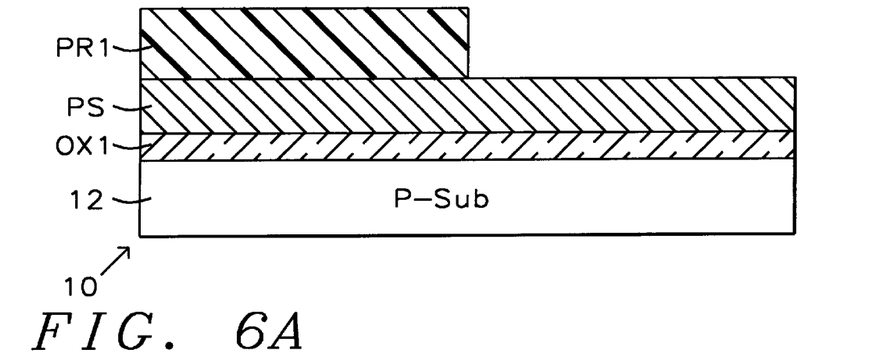
FIGS. 6A–6D illustrate a device in the process of manufacture which forms a single polysilicon layer PS into structures with different resistance values in accordance with the process of FIG. 5.

The method of the third embodiment of the invention is similar to the method of the second embodiment except that the steps are as shown in FIGS. 6A–6D The method of the third embodiment is as follows:

(1) Referring to FIGS. 5 and 6A, the device 10 described above is made by a different sequence of the above steps, starting with step 60 in FIG. 3 with reference to FIG. 6A. The integrated circuit device 10 is made starting with a planar substrate 12, such as a P-doped substrate. During this first step 60, the substrate 12 is coated with a planar silicon dioxide (SiO$_2$) layer OX1 by a CVD process or a thermal process.

This layer can be a gate oxide layer for a gate electrode or can be a field oxide layer for a resistor. A capacitor plate can be formed over either a field oxide layer or a gate oxide layer.

(2) In step 61 deposit a doped polysilicon layer PS, with a thickness from about 0.2 µm to about 0.4 µm, over silicon dioxide layer OX1.

(3) Then, in step 62 define a first photoresist mask PR1 over layer 14 to produce a surface area of the exposed region of the hard mask layer 14 by leaving it without coverage by first photoresist mask PR1.

Figure 6B:
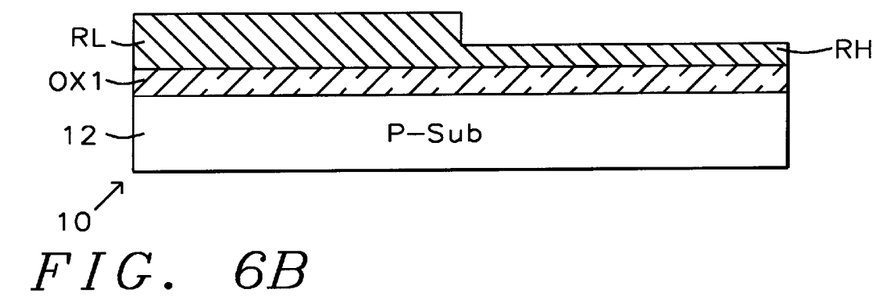

(4) Referring to FIG. 6B, in step 63 of FIG. 5, etch away a substantial thickness of the polysilicon layer PS yielding in the exposed area what is referred to hereinafter as the "high resistance" region RH which has a reduced, predetermined thickness from about 0.05 µm to about 0.15 µm.

The thick polysilicon layer comprises the thick, "high resistance" region RH of polysilicon layer PS with its original thickness.

(5) Referring to FIG. 4B, in step 64, remove the photoresist mask PR1 leaving the thick region RL, as well as thin region RH, exposed.

Figure 6C:
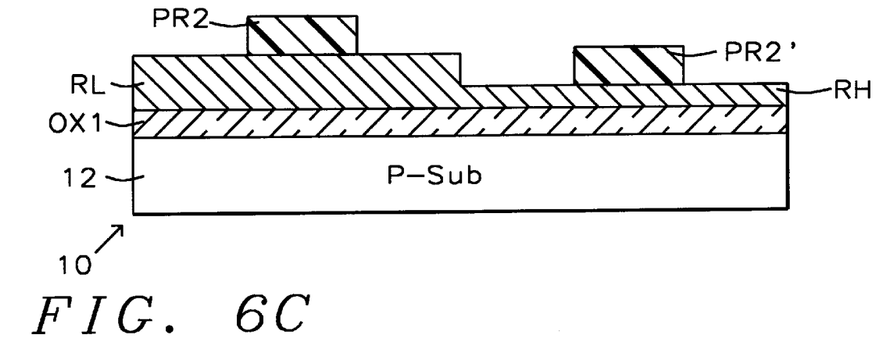

(6) Referring to FIG. 6C, in step 65, form a second mask PR2/PR2' (formed of photoresist) for patterning the thick region RL and the thin region RH using photolithography and etching down to silicon dioxide layer OX1.

Figure 6D:
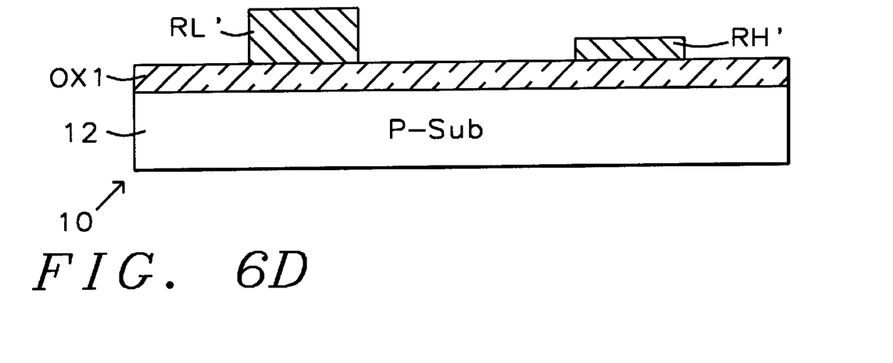

(7) Referring to FIG. 6D, as a result of step 66, layer RL has been patterned by etching down to the silicon dioxide layer OX1 using masks PR2/PR2' into separate thick high resistance resistor RL' under photoresist mask PR2 and thin low resistance resistor PSL' under photoresist mask PR2'.

(8) Then, in step 67 the photoresist masks PR2/PR2' were stripped from the thick high resistance resistor RL' and thin low resistance resistor RH'.

While this invention has been described in terms of the above specific embodiment(s), those skilled in the art will recognize that the invention can be practiced with modifications within the spirit and scope of the appended claims, i.e. that changes can be made in form and detail, without departing from the spirit and scope of the invention. Accordingly all such changes come within the purview of the present invention and the invention encompasses the subject matter of the claims which follow.

What is claimed is:

1. A method of forming a plurality of structures with different resistance values in a single photoresist film comprising the sequence of steps as follows:

first forming an undoped planar polysilicon layer upon a planar substrate (21), then forming a first patterned mask upon said undoped polysilicon layer to expose a first portion thereof (22), then partially etching through said first portion of said planar polysilicon layer to produce a reduced thickness portion thereof while leaving the remainder as a full thickness portion of said polysilicon with said original thickness (23) below said first patterned mask, then with said first patterned mask (25) in place performing the step of doping said polysilicon layer with variable doping as a function of said reduced thickness and said original thickness of said polysilicon forming a thick, high resistance region (PSH) below said first patterned mask and a thin, low resistance region (PSL) in said polysilicon layer (24), then removing said first patteried mask (25), then forming a second patterned mask over said polysilicon layer for patterning said thick, high resistance polysilicon region and for patterning said thin, low resistance polysilicon region (26), and then etching said polysilicon layer through said patterning mask down to said substrate producing a thick, high resistance, polysilicon element from said thick, high resistance region and producing a separate, thin, low resistance polysilicon element from said thin, low resistance region (26).

2. A method in accordance with claim 1 wherein:

said full thickness portion is from 0.2 µm to 0.4 µm thick, and said reduced thickness portion is from 0.05 µm to 0.15 µm thick.

3. A method of forming a plurality of structures with different resistance values in a single photoresist film comprising the sequence of steps as follows:

first forming a doped, planar polysilicon layer upon a planar substrate (61), then forming a first patterned mask upon said planar, doped polysilicon layer to expose a first portion of said planar, doped polysilicon layer and covering a second portion of said planar, doped polysilicon layer (62), and then partially etching through said first portion of said planar, doped polysilicon layer to produce a reduced thickness portion thereof while leaving said second portion of said doped polysilicon layer as a full thickness portion of said doped polysilicon layer with said original thickness (63), then removing said first patterned mask (64), then forming a second patterned mask over said polysilicon layer for patterning said thick, polysilicon region and for patterning said thin, polysilicon region with individual shapes (65), and then etching said polysilicon layer through said patterning mask down to said substrate producing a thick, high resistance, polysilicon element from said thick, high resistance region and a producing a separate thin, low resistance polysilicon element from said thin, low resistance region (66).

4. A method in accordance with claim 3 wherein:

said full thickness portion is from 0.2 µm to 0.4 µm thick, and said reduced thickness portion is from 0.05 µm to 0.15 µm thick.

5. A method of forming a plurality of separate structures with different resistance values in a single photoresist film comprising the sequence of steps as follows:

first forming an undoped, planar polysilicon layer having an original thickness upon a planar substrate (41), then forming a first patterned mask upon said planar polysilicon layer to expose a first portion of said polysilicon layer and to cover a second portion of said polysilicon layer (42), then partially etching through said first portion of said planar, polysilicon layer to produce a reduced thickness first portion of said polysilicon layer while leaving said second portion as a full thickness second portion of said polysilicon layer with said original thickness (43), then removing said first patterned mask (44), and then forming a second patterned mask covering a first region of said reduced thickness, first portion of said polysilicon layer and said second patterned mask covering a second region of said second portion of said polysilicon layer to form a full thickness, polysilicon region, said first region being separate from said second region, and then etching said polysilicon layer through said mask down to said substrate for removing exposed portions of said thin, polysilicon region aside from said first region and for removing exposed portions of said full thickness polysilicon region aside from said second region with said first region being separate from said second region thereby forming said plurality of separate structures, then stripping said second patterned mask, and then doping said polysilicon layer.

6. A method in accordance with claim 5 wherein:

said full thickness portion is from 0.2 µm to 0.4 µm thick, and said reduced thickness portion is from 0.05 µm to 0.15 µm thick.

* * * * *